(12) United States Patent
Van Den Meerakker et al.

(10) Patent No.: US 7,357,877 B2
(45) Date of Patent: Apr. 15, 2008

(54) DISPERSION OF NANOWIRES OF SEMICONDUCTOR MATERIAL

(75) Inventors: Johannes Engelbertus Adrianus Maria Van Den Meerakker, Tilburg (NL); Alfons Blaaderen, Utrecht (NL); Carlos Maria Van Kats, Utrecht (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/535,070

(22) PCT Filed: Nov. 6, 2003

(86) PCT No.: PCT/IB03/50014

§ 371 (c)(1),
(2), (4) Date: May 12, 2005

(87) PCT Pub. No.: WO2004/046021

PCT Pub. Date: Jun. 3, 2004

(65) Prior Publication Data

US 2006/0163199 A1 Jul. 27, 2006

(30) Foreign Application Priority Data

Nov. 18, 2002 (EP) .................................. 02079837

(51) Int. Cl.
*B31D 3/00* (2006.01)
(52) U.S. Cl. ............................ 216/56; 216/13; 216/49; 205/324; 438/691
(58) Field of Classification Search .................. 216/56, 216/13, 49; 205/324
See application file for complete search history.

(56) References Cited

U.S. PATENT DOCUMENTS

| | | | | |
|---|---|---|---|---|
| 5,607,876 A | * | 3/1997 | Biegelsen et al. | 438/45 |
| 5,987,208 A | * | 11/1999 | Gruning et al. | 385/146 |
| 2002/0175408 A1 | * | 11/2002 | Majumdar et al. | 257/734 |
| 2002/0176276 A1 | * | 11/2002 | Zhang et al. | 365/151 |
| 2003/0044608 A1 | * | 3/2003 | Yoshizawa et al. | 428/398 |
| 2003/0091865 A1 | * | 5/2003 | Chen et al. | 428/693 |
| 2003/0098640 A1 | * | 5/2003 | Kishi et al. | 313/309 |
| 2004/0076681 A1 | * | 4/2004 | Dennis et al. | 424/489 |

FOREIGN PATENT DOCUMENTS

WO       WO 02 48701       6/2002

OTHER PUBLICATIONS

Van Den Meerakker et al. (Journal of The Electrochemical Society, 147 (7) pp. 2757-2761 (2000)).*

(Continued)

*Primary Examiner*—Shamim Ahmed
*Assistant Examiner*—Mahmoud Dahimene
(74) *Attorney, Agent, or Firm*—Paul Im

(57) ABSTRACT

A method of manufacturing nanowires (104) is provided, according to which method the nanowires are prepared by anodic etching a semiconductor substrate (10) with an alternating current density, so as to create first regions (4) and second regions (5) with different diameters. Thereafter, the diameters are reduced by preferably repeated oxidation and etching. Finally, the nanowires (104) are dispersed in a dispersion by ultrasonic vibration, through which the coupled nanowires split into individual nanowires of substantially uniform length. The nanowires may then be provided with a surface layer of a suitable material, for instance a luminescent material.

8 Claims, 4 Drawing Sheets

OTHER PUBLICATIONS

Huang et al. (SCIENCE vol. 291, 2001, pp. 630-633).*
Huang et al: "Directed Assembly of One Dimensional Nanostructures Into Functional Networks" Science., vol. 291, Jan. 26, 2001, p. 631.
Cui et al: "Nanowire Nanosensors for Highly Sensitive and Selective Detection of Biological and Chemical Species" Science., vol. 293, Aug. 17, 2001, pp. 1289-1290.
Patent Abstracts of Japan vol. 2002, No. 09, Sep. 4, 2002.

* cited by examiner

DISPERSION OF NANOWIRES OF SEMICONDUCTOR MATERIAL

The invention relates to a method of manufacturing nanowires from semiconductor material, comprising the steps in the precharacterizing part of claim 1.

The invention also relates to a dispersion of nanowires of semiconductor material in a dispersing agent.

The invention further relates to a method of manufacturing a device provided with nanowires on a substrate, in which method a dispersion of nanowires is provided on the substrate.

Such a method is known from J. van den Meerakker, *Proc. Porous Semiconductors*, 9-16 Mar. 2002. The nanowires are anodically etched from a semiconductor substrate in the known method. More than a billion ($10^9$) nanowires can be manufactured thereby in a period of approximately 20 minutes. Diameters of approximately 30 nm were found to be possible, while values of 100 μm could be achieved for the length of the nanowires. After a possible oxidation step and a subsequent etching step, the nanowires can be removed from the substrate by ultrasonic vibration.

It is a disadvantage of the known method that the nanowires have an insufficiently uniform length, in particular if nanowires with a length substantially shorter than 100 μm are formed.

It is accordingly a first object of the invention to provide a method of the kind described in the opening paragraph with which nanowires are obtained having a length which is substantially uniform within a given error margin.

This object is achieved in that the anodic etching is carried out in a first time period and a second time period, which periods correspond to a first and a second region along the nanowires, such that etching takes place in the second period at a higher current density than in the first period so that the nanowires formed have a greater diameter in the first region than in the second region, with the result that the nanowires break off in the second region upon removal, which removal takes place in a bath wherein a dispersion of the nanowires is formed.

The method according to the invention forms a dispersion of nanowires which have a substantially uniform length within an error margin. The method is based on the fact that the etched pores become wider at certain depths with respect to the surface of the substrate. This implies that narrowed portions are formed in certain locations in the nanowire. Then the surface is removed through oxidation. It was surprisingly found here that a layer is removed at the narrowed region—i.e. the second region—which is not substantially thinner than elsewhere—i.e. in the first region. In other words: the narrowed region becomes even thinner so as to form a breaking point. When the substrate with the nanowires is vibrated, preferably ultrasonically, the nanowire will now break at the breaking point. Nanowires are formed in this manner with a length which is substantially uniform within an error margin. The error margin is dependent in particular on the length of the second region. The technology for manufacturing nanowires by anodic etching is described in more detail in the application EP 02075950.2, published not prior to the present application, which is to be incorporated herein by reference.

It is favorable if the step of oxidation and removal of the surface of the nanowires is repeated a number of times. Good results were obtained inter alia with a four-stage cycle of oxidation and etching. The final thickness of the nanowires is found to be well adjustable as a result of this.

In a favorable embodiment, the anodic etching is carried out during a plurality of alternating first and second time periods so as to form a plurality of first and second regions which alternate along the lengths of the nanowires. An advantage of the embodiment is that a larger number of nanowires can be formed. A more important advantage of this is that it can take place without the necessity of providing a new mask at the surface for each and every step. A further advantage is that dispersions can be prepared with nanowires having a limited number of different lengths.

It is favorable to prepare a dispersion of nanowires with a length smaller than 5 μm, more preferably smaller than approximately 3 μm. Particularly favorable are dispersions with nanowires having a length between 0.3 and 1.0 μm. The advantage of these dispersions is their stability, which rises progressively. Nanowires having a length of approximately 5 μm are found to remain stable for approximately one hour in a dispersion not stabilized by a stabilizing agent. This is amply sufficient in practice if the dispersion is used for providing the nanowires on a surface by spinning, printing, or a similar technique. Shorter nanowires, in particular those having a length of up to 1 μm, form colloidally stable dispersions. Such dispersions are desired if the dispersion is provided as a layer, in particular for applications analogous to liquid-crystalline materials.

The material of the substrate may be inter alia GaAs, Si, InP, or some other III-V or II-VI type semiconductor. In the case of Si, the doping may either be n-type or p-type. Exposure takes place in particular on the second surface, i.e. facing away from the surface with the etching mask, in the case of an n-type doping. This is not necessary if a sub-layer of a p-type is present at this second surface. If Si is used, the surface is preferably present at the (100) crystal face. It is possible then to manufacture pyramidal indentations by pre-etching. The manufacture of these indentations takes place, for example, with an etchant solution of KOH. The pyramidal shape arises because the etching in the (111) direction substantially does not take place.

In a further, interesting embodiment, the nanowires are provided with a layer of a desired material in the dispersion. Nanowires are prepared in this manner that can be provided from a solution on a surface and that can thus provide desired functional characteristics. The nanowires that can be obtained by the method according to the invention have shapes that are roughly halfway between cuboid and cylindrical. They have some rigidity at the same time. This means that they have a comporaratively large surface area in relation to their volume, which may be used to advantage.

The nanowires thus obtained have the advantage of a large surface area compared with spherical bodies. Compared with nanowires of gold, the nanowires of semiconductor material, in particular silicon, have the advantages of low cost and easy processing. The nanowires have the advantage over the provision of the material as a layer that they are present in a stable dispersion, preferably based on simple solvents such as water and ethanol. The provision of the material on a surface thus poses no health or environmental risks. The nanowires have the advantage over crystals that a large number of bodies of uniform dimensions are available and that they have a good adhesion.

The layer of the desired material is preferably provided in a sol-gel process. Alternatively, the layer may be provided in that a salt is caused to be deposited on the surface of the nanowires, which salt is introduced into the dispersion in a concentration in excess of its solubility product. The nanowires may thus equally well serve as crystallization nuclei or as bodies for selective adsorption.

If the material comprises, for example, luminescent groups, surfaces of objects may be provided with luminescent particles in a coating process. Luminescence may be realized in patterns in that a structure is provided on the surface. If a magnetic material is provided, the magnetic susceptibility of a medium can be enhanced. Optical or electrical properties of the medium may also be adjusted through the use of nanowires according to the invention with surface layers of a suitable material.

In a favorable embodiment, the material is provided in a sol-gel process. A particularly favorable modification is the provision of a silicon dioxide layer by means of a tetra-ethoxyorthosilicate (TEOS), with a coloring agent—such as an isothiocyanate—being chemically bound to the layer. The binding of such coloring agents to silica particles is known per se from van Blaaderen and Vrij, *Langmuir*, 8 (1992), 2921-2931. This takes place in particular through coupling of the isothiocyanate to an alkoxysilane, such as (3-aminopropyl)-triethoxysilane, whereupon the reaction product is added to the TEOS solution. This TEOS solution is subsequently mixed with the dispersion.

It is a second object of the invention to provide a dispersion of nanowires of semiconductor material, which dispersion can be provided on a substrate by usual techniques. This object is achieved in that such a dispersion is obtainable by the method according to the invention.

It is another object of the invention to provide a dispersion or solution by means of which a desired material can be provided on a surface by usual techniques. This object is achieved in a dispersion of nanowires of a semiconductor material in a dispersing agent, which nanowires are provided with a surface layer of the desired material. A first advantage of the dispersion is that it is also very suitable for rough surfaces or surfaces that are non-planar in some other way. Such surfaces may remain partly uncoated with the use of thin-film techniques, whereas a reasonable distribution is obtained with the dispersion according to the invention because of its somewhat coarser consistency. A second advantage of the dispersion is that the desired material may also be provided in this manner on surfaces or in dispersions that may or may not be viscous or cured, to which surfaces the desired material in principle has an insufficient adhesion, or in which dispersions it is not or insufficiently stable. The nanowire here is in fact a tiny carrier body to which the desired material is adsorbed. A third advantage of the dispersion is that the constituent nanowires have a comparatively large surface area, in particular in comparison with spherical bodies.

Favorable results were obtained with a dispersion in which the nanowires have a length of between 0.3 and 1.0 µm, which length is more preferably uniform within a given error margin. Such a dispersion is stable without any further stabilizing agents. This is relevant in particular for applications in which the dispersing agent is not removed and the nanowires are not adhered to the surface. Such applications are those, for example, which are analogous to liquid-crystalline materials, in particular for creating optical effects controlled by a variation in the applied electrical voltages or currents. In this case the dispersion will in addition contain salts in a desired concentration, by means of which the switching behavior of the nanowires can be optimized. Nanowires of Si as the semiconductor material are particularly suitable for this purpose because of their high refractive index. A nanowire is preferably used for such an application whose surface is provided with a surface layer of $SiO_2$, which is possibly modified and provided on the nanowire in a sol-gel process. Compared with a dispersion of comparable nanowires of Au, as known from B. van der Zande et al., *J. Phys. Chem. B*, 103 (1999), 5754-5760, the advantage of the nanowires of a semiconductor material with a surface layer is that they are easier to obtain and that the resulting dispersion can be optimized and stabilized in a simpler manner.

Dispersing agents used may be usual agents such as ethanol, water, and other alcohols or alkoxy alcohols. Stabilizers for colloidal solutions may be added.

It is a third object of the invention to provide a method of manufacturing a device wherein a dispersion of nanowires is provided on a substrate. This object is achieved in that one of the dispersions of nanowires of semiconductor material according to the invention is provided.

After the provision of the dispersion and the deposition of the nanowires, the dispersing agent may be removed by rinsing and subsequent evaporation. Another possibility is that the dispersion is cured, or that it is provided in a liquid bath. The dispersion may possibly contain further functional components which stabilize the dispersion, or which are deposited along with the nanowires.

In a first modification, the device is an electronic device with transistors, picture display elements, sensors, or passive elements, wherein the nanowires or the dispersion of nanowires form an active layer in the element, i.e. the semiconductor layer or the electro-optical layer. The advantage of the method then is that this active layer can be provided from the solution.

In a second modification, the nanowires, after being provided, are present in a surface layer of the device. Examples are coatings, packing materials, and the like. The nanowires according to the invention offer the possibility of incorporating a functionality in such coatings. Advantages of the nanowires according to the invention are here firstly their comparatively large surface area, secondly their simplicity of manufacture, thirdly the chemical stability of the material, and fourthly the uniformity of length. An example of the above is the implementation of nanowires with a surface layer of a luminescent material in balls and other, usually movable objects for handling. Another example is the use of nanowires in so-called security coatings for integrated circuits. These coatings serve to prevent that such circuits can be opened and, after unauthorized modification, can be covered and used again. The security coating should be opaque and chemically inert for this purpose. Preferably, a sol-gel technique is used for providing the coating, more preferably, the sol-gel solution comprises monoaluminum phosphate as an ingredient. Furthermore, it preferably comprises dispersed particles which provide an inhomogeneously distributed capacitance or magnetic susceptibility. The dispersion according to the invention is highly suitable for this, in particular if nanowires of different lengths and with different surface layers are present in the dispersion. The resulting device is thus an electronic device as claimed in Claim 13. The layer may be, for example, a surface layer, an active layer or a security coating. The length distribution may include one or more discrete lengths, or a suitable distribution.

These and other aspects of the method of preparing a dispersion, the dispersion itself, and the method of manufacturing a device according to the invention will be explained in more detail with reference to the following Figures, in which:

FIG. 1 diagrammatically shows an arrangement with which the method can be carried out;

Figure 1:
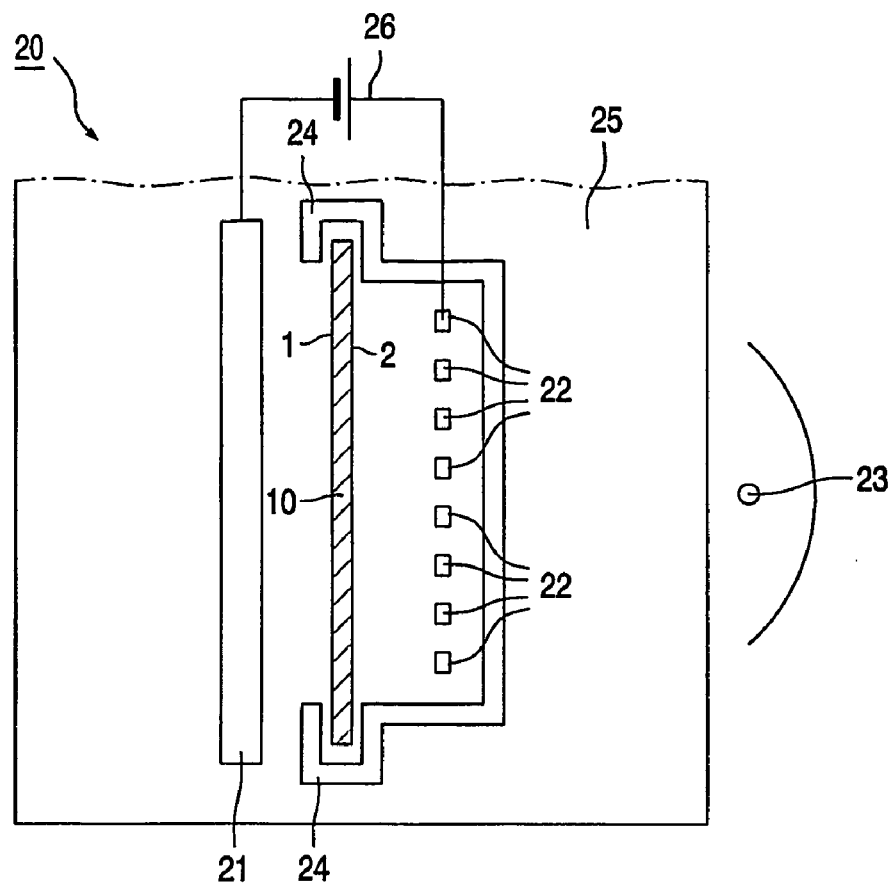

Identical components have been given the same reference numerals in the Figures. The drawings are not true to scale and merely show examples. As will be clear to those skilled in the art, alternative embodiments are conceivable within the scope of protection of the claims.

FIG. 1 diagrammatically shows an arrangement 20 for carrying out the method according to the invention. The arrangement 20 comprises an etching bath 25 in which a cathode 21 and an anode 22 are present, interconnected by a current source 26. The cathode 21 is a Pt plate with a surface area of 196 cm$^2$ in this example. The anode 22 is constructed as a Pt gauze, because this scatters and transmits light. The arrangement further comprises an electrolytic cell 24 in which a semiconductor substrate 10 is placed. If a semiconductor substrate of Si with an n-type doping is used, a light source 23 is switched on. The light source 23 used is preferably a tungsten halogen lamp. The etching bath 25 is a solution of ethanol (0 to 30 M), HF (1 to 10 M), and cetyltrimethylammoniumchloride (CTAC, 0 to 0.02 M) in water. The etching bath 25 has a volume of 7.9 l. The solution is pumped through a thermostat which keeps the temperature of the bath constant to within 1° C. The temperature is set in a range between 0 and 60° C. The electrolytic cell 24 is bounded by the substrate 10, a polypropylene chamber, and a plate of light-transmitting polycarbonate. A solution of 0.13 M $K_2SO_4$ is present in the cell. The potential difference between the anode 22 and the cathode 21 is typically of the order of 30 V, the current density being of the order of 10 to 300 mA/cm$^2$. The anode 22 is connected to the substrate 10 via the electrical conduction through the $K_2SO_4$ solution.

FIG. 2 diagrammatically shows the substrate 10 in detail in three stages of the method of manufacturing nanowires 104. This substrate 10 has a surface 1 and a second surface 2 facing away from the former and preferably substantially parallel thereto. A patterned etching mask is provided on the surface 1. The substrate 10 is etched from this surface 1. For this purpose, the semiconductor substrate 10 is present with its surface 1 in the etching bath 25 of water, ethanol, HF, and the surfactant cetyltrimethylammoniumchloride (CTAC), and with its second surface 2 in the $K_2SO_4$ solution of the electrolytic cell 24 (the etching bath and electrolytic cell are not shown in FIG. 2). The conductive potassium sulphate solution provides an electrically conducting connection between the anode and the second surface 2 of the substrate 10. The substrate 10 is p-type doped at the surface 1 in a concentration of approximately $10^{15}$ atoms/cm$^3$, corresponding to a specific resistance of 10 to 30 Ω.cm. The dopant used is B. Good results were also obtained in other experiments with higher specific resistances of up to 1000 Ω.cm. The rear 2 of the semiconductor substrate 10 is strongly doped with B (doping level $10^{20}$ atoms/cm$^3$ or higher). To improve the conduction of the second surface 2 of the substrate 10 further, a conductive layer may be provided, for example of Al.

Figure 2A:
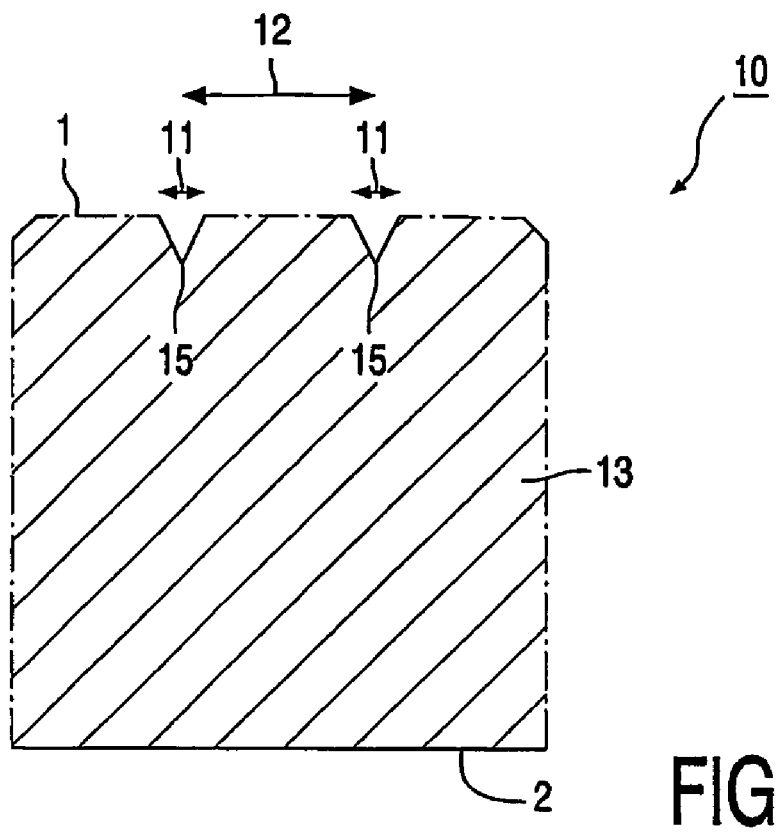
FIG. 2 is a detailed diagrammatic picture of a semiconductor substrate to which the method is applied.

FIG. 2A shows the substrate 10 after indentations 15 were provided in the front 1. The indentations 15 are formed from the openings in an already provided patterned etching mask. This etching mask is manufactured as follows: a 140 nm thick layer of $Si_3N_4$ and a photoresist are provided in that order on the substrate 10. Said photoresist is locally exposed through a mask in which holes of 1.5 µm diameter are present. The pitch 12 of the openings is 3.5 µm. The pitch is defined as the distance between the centers of two mutually adjoining openings. The photoresist is dissolved in the exposed locations, so that the $Si_3N_4$ becomes exposed. The $Si_3N_4$ is etched with a, preferably concentrated, solution of $H_3PO_4$. Then the photoresist is removed in an oxygen plasma. The semiconductor substrate 10 is placed in an 8.8 M KOH bath of 70° C. for eight minutes. The KOH bath thus etches the semiconductor substrate 10 of Si away in the fast (100) crystal direction, whereas the slow (111) crystal direction remains substantially unaffected. In this manner, more than a billion ($10^9$) pyramid-shaped pointed indentations 15 of substantially identical shape are defined in the surface 1 of the semiconductor substrate 10 having a diameter of 150 mm. A pattern of a hexagonal grid is formed thereby.

Figure 2B:
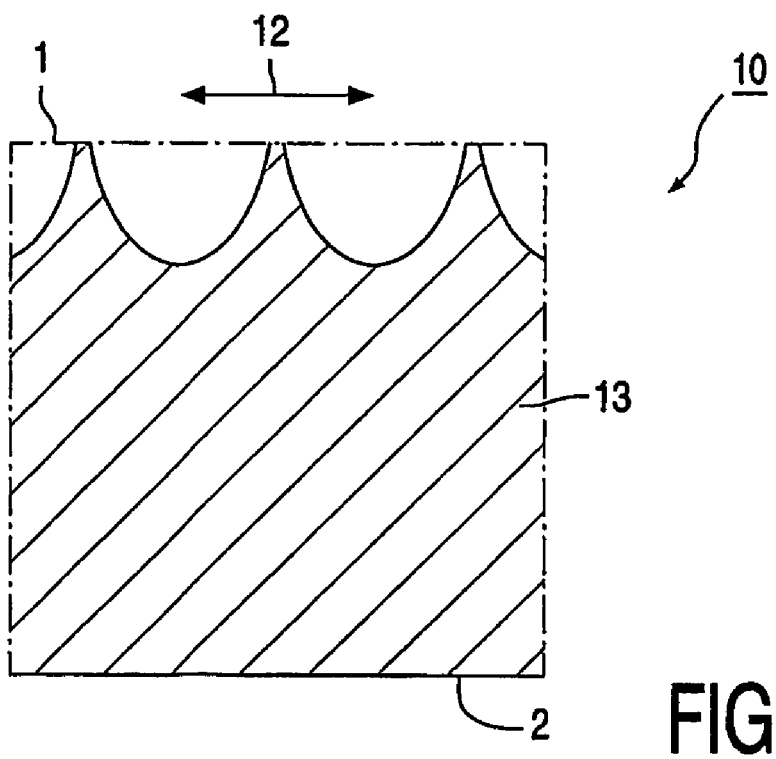

FIG. 2B shows the substrate 10 after a period of anodic etching. The temperature, the HF concentration, and the applied potential are set for the etching treatment such that the current density is greater than 90% of the peak current density $I_{ps}$. This is the case, for example, in a bath with a HF concentration of 3.0 M and a temperature of 30° C. at a current density of 60 mA/cm$^2$. It was found that etching takes place isotropically in a first phase. Etching then continues anisotropically.

Figure 2C:
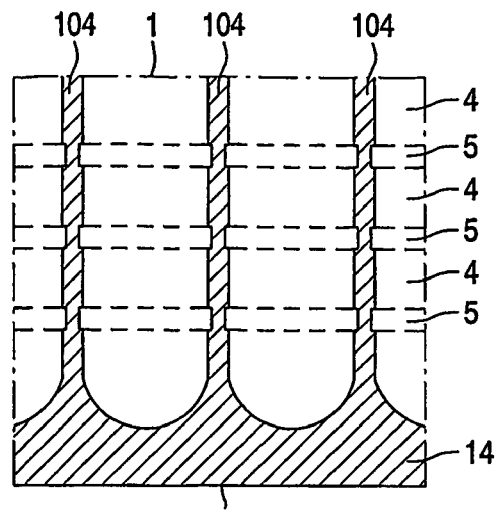

FIG. 2C shows the semiconductor substrate in a further stage after etching has taken place in a first period at a current density of 65 mA/cm$^2$ and in a second period at a current density of 100 mA/cm$^2$. This etching in a first and in a second period is then repeated a number of times. The result is that mutually coupled nanowires 104 are obtained after the pores have overlapped, with first regions 4 having a first diameter and second regions 5 having a second diameter. The second diameter is smaller than the first diameter. The first regions 4 in this example had a length of 5 µm and the second regions 5 a length of 1.0 µm. These lengths, however, may be adjusted as desired. Adjustment takes place through the choice of the etching times. A greater uniformity is obtained in that the ratio of the lengths of the first and the second regions 4, 5 is increased. The length of the nanowires 104 can be set for a desired length between approximately 0.2 and 10 µm, and even longer. The second regions are chosen to lie between approximately 0.1 and 1.0 µm. Adjustment takes place through the choice of the etching time. Improvements can still be made here, however, through optimization and automation of the variation in current density.

Figure 2D:
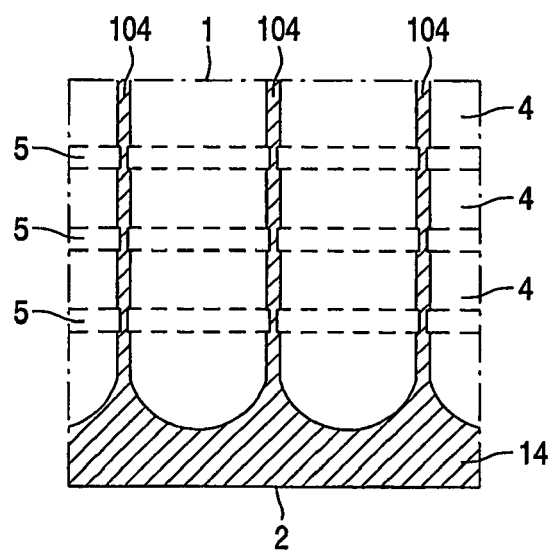
Figure 3:
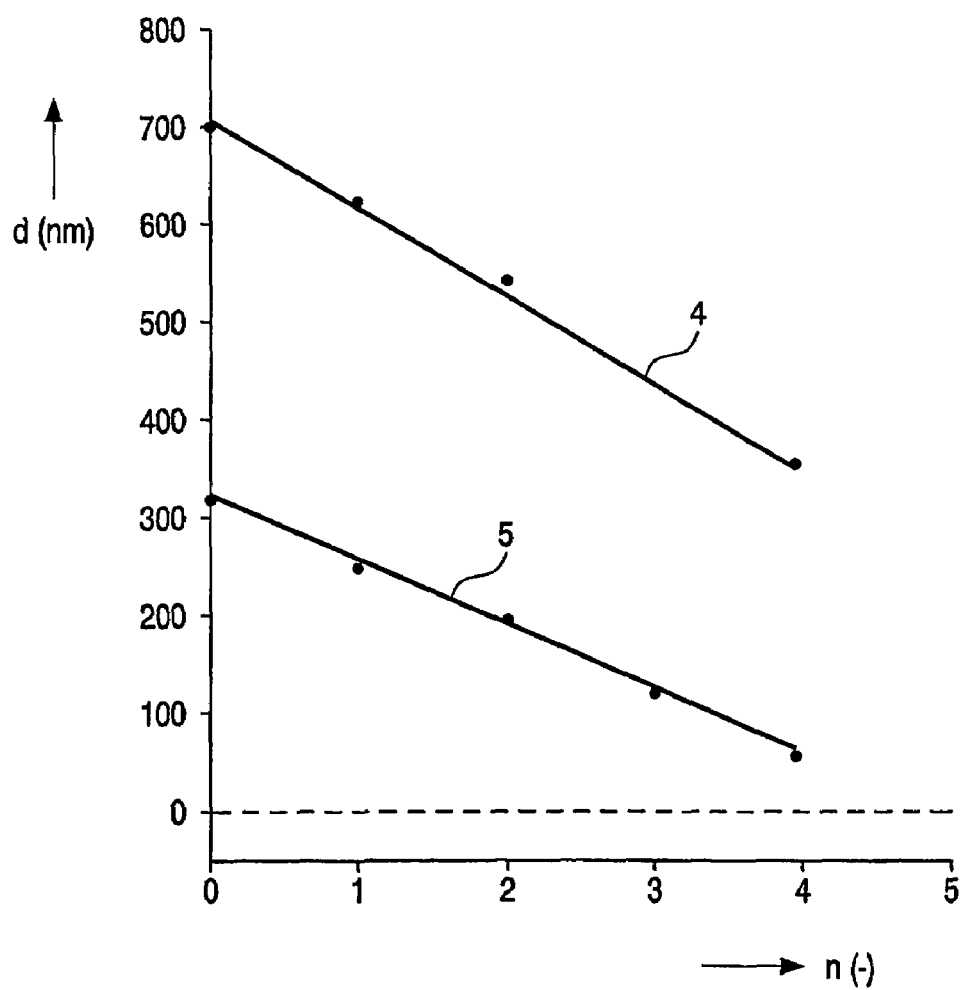
FIG. 3 is a graph in which the diameter of the nanowires d is plotted as a function of the number of oxidation and etching steps in a first embodiment of the method.

FIG. 2D shows the semiconductor substrate 10 in a further stage again, after the surface of the nanowires 104 has been removed by oxidation followed by etching. Oxidation was carried out by heating at 950° C. for approximately 15 minutes. Etching was carried out by immersion of the nanowires in a 3.75 M HF solution. In this example, in which the initial diameter of the nanowires was a few hundreds of nanometers, this resulted in a thinning of 100 to 150 nm per step. A total of four oxidation and etching steps was carried out. The resulting thickness d (in naometers) of the first regions 4 and the second regions 5 of the nanowires 104 is shown in FIG. 3 as a function of the number of steps n. In other experiments, nanowires with a thickness of less than 200 nm, and even less than 50 nm, were obtained through an increase in the current densities and more favorable settings during oxidation and etching.

Figure 2E:
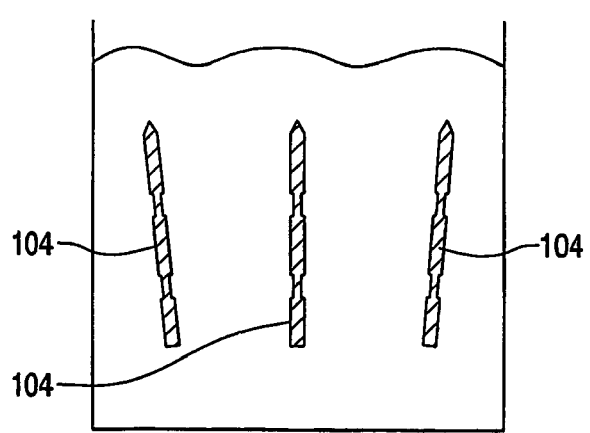

FIG. 2E shows a dispersion 50 of mutually coupled nanowires 104. The nanowires 104 have been detached from the semiconductor substrate (not shown here) by ultrasonic vibration. The dispersion 50 contains ethanol or a mixture of ethanol and water as the dispersing agent.

Figure 2F:
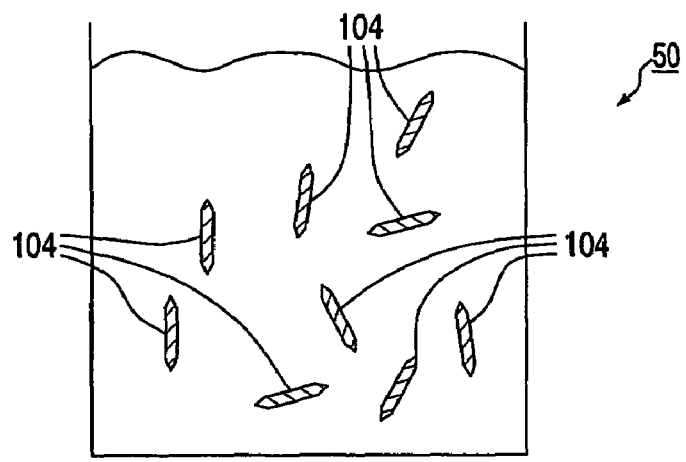

FIG. 2F shows the dispersion 50 after the mutually coupled nanowires 104 have been detached from one another. This was realized in that the ultrasonic vibration treatment was continued for approximately 30 minutes. The resulting nanowires 104 of first experiments showed a polydispersity of approximately 25%, both in length and in diameter.

Ammonia and tetraethoxyorthosilicate (TEOS) are added to the dispersion thus obtained until an ethanol solution of 6.0 M water, 1.0 M ammonia, and 0.15 M TEOS has been obtained. This dispersion was continuously stirred at room temperature for approximately 1 hour. Then the dispersing agent is removed through a filter, whereupon the residue—the nanowires—is dispersed again in a mixture of water and ethanol. This results in nanowires provided with a surface layer of $SiO_2$. The surface layer has a thickness of 50 to 100 nm. It appears to be favorable for optimizing the method if the coupled nanowires are briefly oxidized before being detached from the substrate, whereby a thin oxide layer is formed in advance. If a luminescent surface layer is desired, a modified ethoxysilicate is also added to the dispersion. The resulting dispersion may be provided on a substrate in a known manner.

Figure 4:
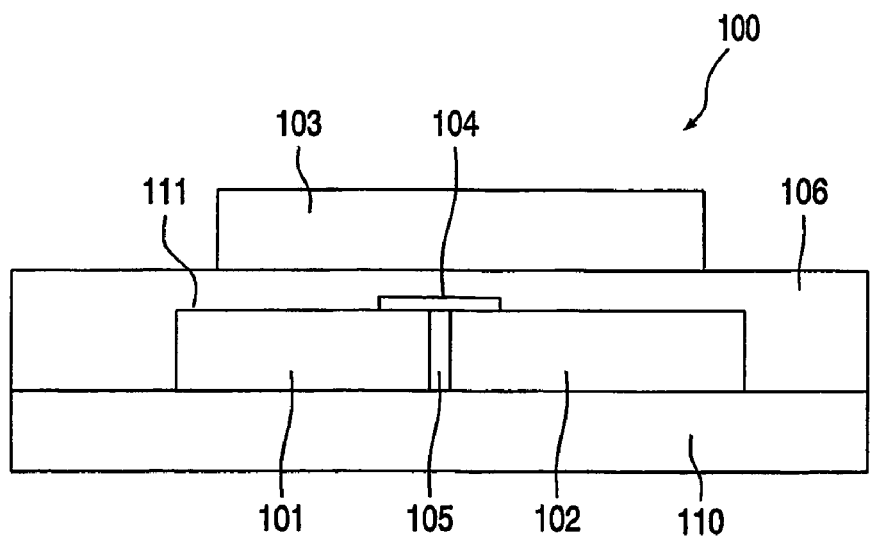
FIG. 4 is a diagrammatic cross-sectional view of an electronic device according to the invention.

FIG. 4 is a diagrammatic cross-sectional view of an embodiment of a device, in this case a thin-film transistor 100. A source electrode 101 and a drain electrode 102 are provided on a polyimide substrate 110. The electrodes 101, 102 comprise, for example, Au and are lithographically defined. The electrodes 101, 102 are mutually separated by a channel 105 which comprises a dielectric material with preferably a low dielectric constant. Suitable materials are inter alia silicon dioxide, hydrogen- and methylsilsesquioxane, porous silica, SiLK, and benzocyclobutene. The choice of material also depends on the choice of substrate. The surface 111 of the electrodes 101, 102 and the channel 105 are planarized, so that nanowires 104 are present on a substantially planar surface 111. The nanowires 104 are laid down and aligned in that a droplet of a dispersion with the nanowires is provided on the surface 111, during which a voltage is applied. The nanowires 104 were aligned by the applied AC voltage of more than 25 V at a frequency of 1 kHz. A dielectric layer 106 separating the gate electrode 103 from the nanowires 104 is present on the nanowires 104. Alternatively, the alignment may take place in that a mold with channels is provided on the surface 111, and the entire assembly is placed in a bath with the dispersion of nanowires. A flow is induced by a pressure difference, and the nanowires are sucked into the channels of the mold. This leads to a positioning of aligned nanowires.

As will be clear to those skilled in the art, an electronic device will preferably comprise a large number of semiconductor elements 100 which are interconnected in a desired pattern and form a circuit. It is further noted that a large number of nanowires 104 may be present in a single semiconductor element 100, and that various materials may be chosen for the substrate 110, the electrodes 101, 102, 103, and the dielectric layers 105, 106, as is known to those skilled in the art of thin-film transistors. It is furthermore noted that the dispersion of nanowires according to the invention may also be used for different devices, which will take place in a comparable manner but with different substrates, electrodes, and covering layers known to those skilled in the art.

Summarizing, a method of manufacturing nanowires is provided whereby the nanowires are prepared through anodic etching of a semiconductor substrate with an alternating current density. First and second regions of different diameters are formed thereby in the nanowires. The diameters of the first and second regions are subsequently reduced by preferably repeated oxidation and etching steps. Finally, the nanowires are dispersed in a dispersion by ultrasonic vibration, which vibration causes the coupled nanowires to split up into individual wires of substantially uniform length. The nanowires may subsequently be provided with a surface layer of a desired material, for example a luminescent material.

The invention claimed is:

1. A method of manufacturing nanowires from semiconductor material, comprising the steps of:
   providing a patterned etching mask having openings on a surface of a substrate made of the semiconductor material, which openings have a substantially uniform pitch;
   placing the substrate with the etching mask in a liquid etchant for the semiconductor material;
   anodically etching so as to form substantially parallel pores with a pitch corresponding to the pitch of the openings in the etching mask at a current density such that the diameter of the pores becomes at least as great as the pitch of the pores, whereby nanowires are formed;
   oxidizing a surface of the nanowires, whereupon said surface is removed by etching; and
   removing the nanowires from the substrate by means of vibration,
   wherein the anodic etching is carried out in a first time period and a second time period, which periods correspond to a first and a second region along the nanowires, such that etching takes place in the second period at a higher current density than in the first period so that the nanowires formed have a greater diameter in the first region than in the second region, with the result that the nanowires break off in the second region upon removal.

2. A method as claimed in claim 1, wherein the removal takes place in a bath wherein a dispersion of the nanowires is formed.

3. A method as claimed in claim 1, wherein the step of oxidation and removal of the surface of the nanowires is repeated a number of times.

4. A method as claimed in claim 1, wherein the anodic etching is carried out during a plurality of alternating first and second time periods so as to form a plurality of first and second regions which alternate along the lengths of the nanowires.

5. A method as claimed in claim 1, wherein the nanowires are provided with a layer of a desired material in the dispersion.

6. A method as claimed in claim 5, wherein the desired material is provided by means of a sol-gel process.

7. A method as claimed in claim 5, wherein the material is silicon dioxide to which a luminescent coloring agent is bound.

8. A method of manufacturing a device provided with nanowires on a substrate, in which method a dispersion of nanowires is provided on the substrate, wherein the dispersion as claimed in claim 7 is provided on the substrate.

* * * * *